(12) United States Patent
Yau

(10) Patent No.: US 7,301,229 B2
(45) Date of Patent: Nov. 27, 2007

(54) ELECTROSTATIC DISCHARGE (ESD) PROTECTION FOR INTEGRATED CIRCUIT PACKAGES

(75) Inventor: Sin-Him Yau, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/876,980

(22) Filed: Jun. 25, 2004

(65) Prior Publication Data

US 2005/0285280 A1 Dec. 29, 2005

(51) Int. Cl.
*H01L 23/12* (2006.01)
*H01L 23/053* (2006.01)
*H01L 23/48* (2006.01)
*H01L 23/52* (2006.01)
*H01L 29/40* (2006.01)

(52) U.S. Cl. .................. 257/700; 257/762; 257/773; 257/E23.011

(58) Field of Classification Search .......... 257/700, 257/762, 773
See application file for complete search history.

(56) References Cited

U.S. PATENT DOCUMENTS

| | | | | |
|---|---|---|---|---|
| 4,928,162 | A * | 5/1990 | Lesk et al. ............... | 257/693 |
| 5,114,880 | A * | 5/1992 | Lin ........................... | 438/107 |
| 5,712,753 | A | 1/1998 | Yeh et al. | |
| 5,715,127 | A | 2/1998 | Yu | |
| 5,818,086 | A | 10/1998 | Lin et al. | |
| 5,869,870 | A | 2/1999 | Lin | |
| 6,008,532 | A * | 12/1999 | Carichner ................. | 257/691 |
| 6,016,000 | A * | 1/2000 | Moslehi .................... | 257/522 |
| 6,025,631 | A | 2/2000 | Lin | |
| 6,078,502 | A * | 6/2000 | Rostoker et al. ......... | 361/723 |
| 6,211,565 | B1 | 4/2001 | Yu | |
| 6,329,223 | B2 * | 12/2001 | Yu ............................ | 438/123 |
| 6,433,411 | B1 * | 8/2002 | Degani et al. ............ | 257/678 |
| RE37,982 | E | 2/2003 | Yu | |
| 6,638,789 | B1 * | 10/2003 | Glenn et al. ............. | 438/109 |
| 6,800,930 | B2 * | 10/2004 | Jackson et al. .......... | 257/700 |

OTHER PUBLICATIONS

Masatoshi Matsumoto et al., "New Failure Mechanism due to Non-Wired Pin ESD Stressing", EOS/ESD Symposium 94-90, pp. 2.5.1-2.5.6.
Masatoshi Matsumoto et al., "New Failure Mechanism due to Non-Wired Pin ESD Stressing", EOS/ESD Symposium 94-90, pp. 2.5.1-2.5.6, no date available.

* cited by examiner

*Primary Examiner*—Ngân V. Ngô
(74) *Attorney, Agent, or Firm*—Duane Morris LLP

(57) ABSTRACT

An integrated circuit package includes a package substrate with a plurality of pins coupled to a semiconductor chip having a plurality of bond pads, some of which are ic bond pads coupled to an integrated circuit formed on the semiconductor chip and others of which are floating bond pads that are isolated from the integrated circuit. The plurality of pins include active pins coupled to active bond pads and dummy (non-coupled) pins coupled to floating bond pads. The floating bond pads are formed of interconnect materials also used to form the integrated circuit. BGA or flip-chip IC packages may be used and a method is provided for forming the IC package. The floating bond bad design prevents ESD (electrostatic discharge) from damaging the active device due to an adjacent non-coupled pin of the package being subjected to ESD.

14 Claims, 5 Drawing Sheets

ELECTROSTATIC DISCHARGE (ESD) PROTECTION FOR INTEGRATED CIRCUIT PACKAGES

FIELD OF THE INVENTION

The invention relates to electrostatic discharge (ESD) protection in integrated circuit (IC) packages, and more particularly, to the coupling of no-connect pins to floating bond pads to provide ESD protection.

BACKGROUND OF THE INVENTION

Electrostatic discharge (ESD) is the movement of static electricity from a nonconductive surface, which could cause damage to semiconductors and other circuit components in integrated circuits. A person walking on a carpet, for instance, can carry an electrostatic charge of up to several thousands of volts under high humidity conditions and over 10000 volts under low humidity conditions. ESD may be imparted to an integrated circuit within an IC package when the integrated circuit or the IC package is contacted by an electrostatic charge source that may be encountered during assembly or afterwards when the device is in the field. When "zapped", i.e., subjected to electrostatic discharge, the instantaneous power level of the ESD could cause severe damage to the integrated circuits.

An IC package typically includes a metal lead frame or other package substrate coupled to a semiconductor chip. The semiconductor chip includes the integrated circuit which has several active bond pads that couple the integrated circuit to outside components. The metal lead frame or other package substrate includes a plurality of pins or other contacts that are coupled to respective bond pads of the integrated circuit formed on the semiconductor chip. The coupling may be achieved by wire bonding to a metal lead frame, for example, or it may be achieved by flip-chip packaging which involves directly joining the contact areas of the package substrate to corresponding bond pads of the semiconductor chip using solder bump. In a typical IC package, the metal lead frame includes at least one pin that is not coupled to a corresponding bond pad. Such pins are referred to as non-wired or non-coupled pins.

In the prior art arrangement shown in FIG. 1, IC package 115 includes semiconductor chip 101 coupled to lead frame 103. Lead frame 103 includes a plurality of pins including coupled pins 105 and non-coupled pins 107. Coupled pins 105 are coupled by means of wire bonds 111 to corresponding bond pads 113 that are coupled to, and form part of, the integrated circuit formed on semiconductor chip 101. In contrast, non-coupled pins 107 of lead frame 103 are not coupled to semiconductor chip 101 in conventional designs.

During handling, installation, testing and use in the field, the coupled pins and the non-coupled pins are equally likely to be subjected to electrostatic discharge, i.e., zapped. When one of the non-coupled pins is subjected to ESD, it may induce ESD failure on the adjacent, coupled pin which was not zapped. More particularly, when the non-wired pin becomes subjected to ESD discharge, it may damage active circuit components of the integrated circuit by coupling the electrostatic discharge through the adjacent, coupled pin, to the bond pad and therefore the integrated circuit.

ESD damage due to an adjacent pin being zapped is discussed in detail in a paper entitled "*New Failure Mechanism Due to No-connect Pin ESD Stressing*", by Matsumoto of Japan in 1994 EOS/ESD Symposium, pp. 90-95. The paper reveals the fact that, when a human body model (HBM) ESD pulse is repeatedly applied to a no-contact pin on an IC package, any of the two neighboring pins, if wired to the internal circuit, would become vulnerable to ESD damage. This is because the electrostatic charge will accumulate in the resin around the no-contact pin resulting in a large potential difference between the no-contact pin and its neighboring pins, which would significantly reduce the ESD resistance capability of the neighboring pins.

It would therefore be desirable to reduce the probability of ESD damaging a device through a coupled pin due to a non-coupled pin being subjected to electrostatic discharge.

SUMMARY OF THE INVENTION

To achieve these and other objects, and in view of its purposes, the invention provides an assembly comprising a package substrate having a plurality of pins and coupled to a semiconductor chip. Each of the plurality of pins is connected to either an ic bond pad disposed on the semiconductor chip and coupled to an integrated circuit of the semiconductor chip, or a floating bond pad disposed on the semiconductor chip and isolated from the integrated circuit of the semiconductor chip.

In another embodiment, the invention provides an assembly comprising a package substrate having a plurality of contacts and coupled to a semiconductor chip. Each of the plurality of contacts is connected to either an ic bond pad disposed on the semiconductor chip and coupled to an integrated circuit of the semiconductor chip, or a floating bond pad disposed on the semiconductor chip and isolated from integrated circuit of the semiconductor chip.

In another embodiment, the invention provides an assembly comprising a package substrate having a plurality of pins and which is coupled to a semiconductor chip that includes an integrated circuit. The plurality of pins include a plurality of active, ic pins that are each coupled to an active bond pad coupled to an integrated circuit, and at least one dummy pin connected to a floating bond pad that is disposed on the semiconductor chip and isolated from the integrated circuit.

In still another embodiment, the invention provides a method for suppressing electrostatic discharge damage in an integrated circuit. The method includes providing a package substrate having a plurality of pins including at least one non-active pin, providing a semiconductor chip with an integrated circuit thereon, the integrated circuit including a plurality of ic bond pads, and forming at least one floating bond pad on the semiconductor chip, each floating bond pad isolated from the integrated circuit. The method further includes coupling each non-active pin to a floating bond pad of the at least one floating bond pad.

The apparatus and method of the present invention may be used to suppress electrostatic discharge damage in integrated circuit packages that are formed by wire bonding or by flip-chip mounting techniques.

BRIEF DESCRIPTION OF THE DRAWING

The invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity and may not be suggestive of actual or relative dimensions of the illustrated features. Like numerals denote like features throughout the specification and drawing. Included in the drawing are the following figures.

DETAILED DESCRIPTION OF THE INVENTION

The invention is directed to providing floating bond pads on a semiconductor chip that includes an integrated circuit. The floating bond pads are formed of the same materials used to form components of the integrated circuit and are formed using and during the manufacturing processes used to form the integrated circuit on the semiconductor chip, but the floating bond pads are electrically isolated from the integrated circuit. Integrated circuits are typically formed of many layers of conductive material. The floating bond pads may each be formed of a discrete portion of one or more of the conductive layers used to form the integrated circuit. The discrete portion is formed from the same layer of conductive material also used to form conductive features of the active integrated circuit and using the same patterning operations such as photolithography and etching operations. Surface or damascene patterning processes may be used. The invention also provides for forming an IC package such that each of the pins of the IC package is coupled to either an active bond pad of the integrated circuit or a floating bond pad.

Figure 1:
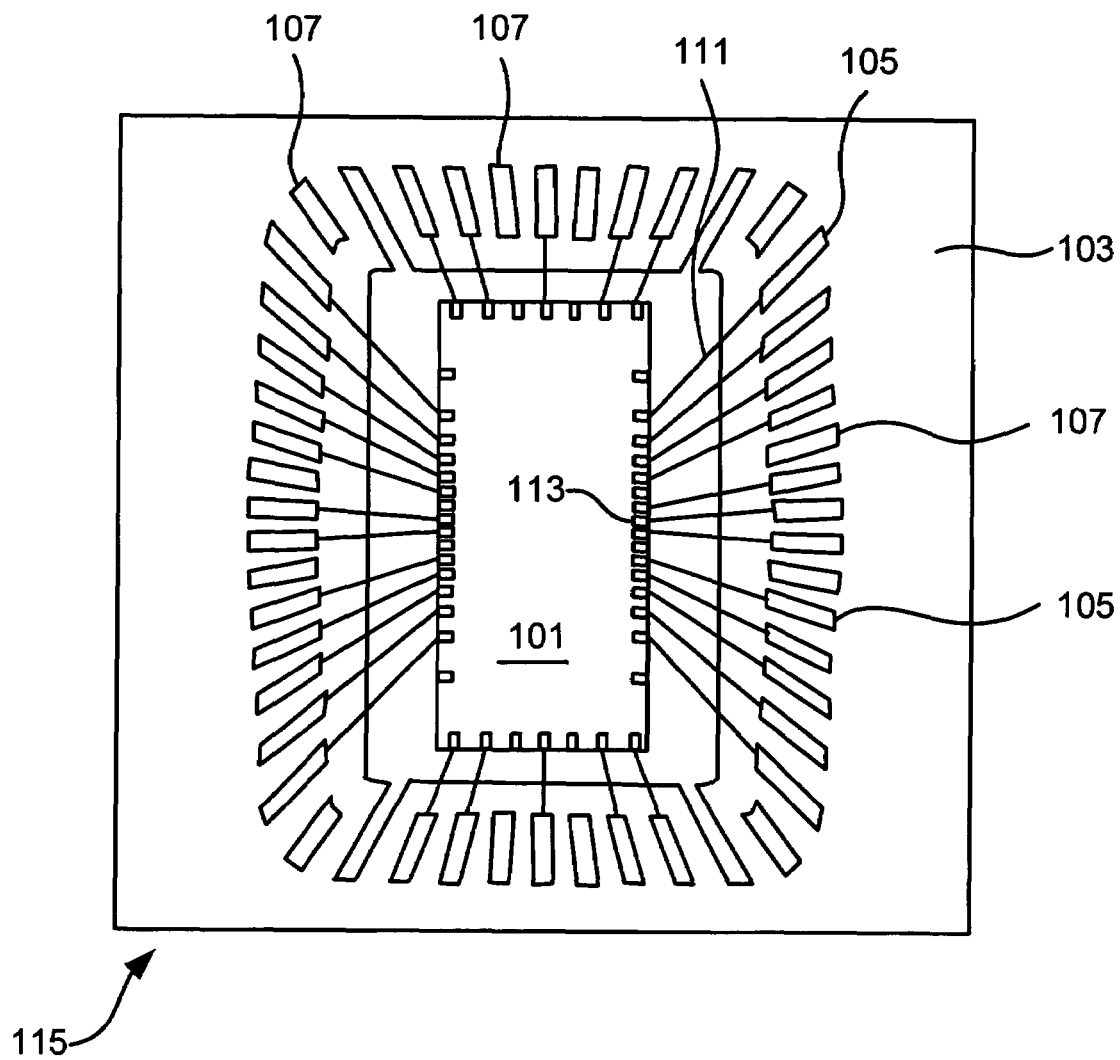
FIG. 1 is a plan view of an integrated circuit package according to the PRIOR ART.
Figure 2:
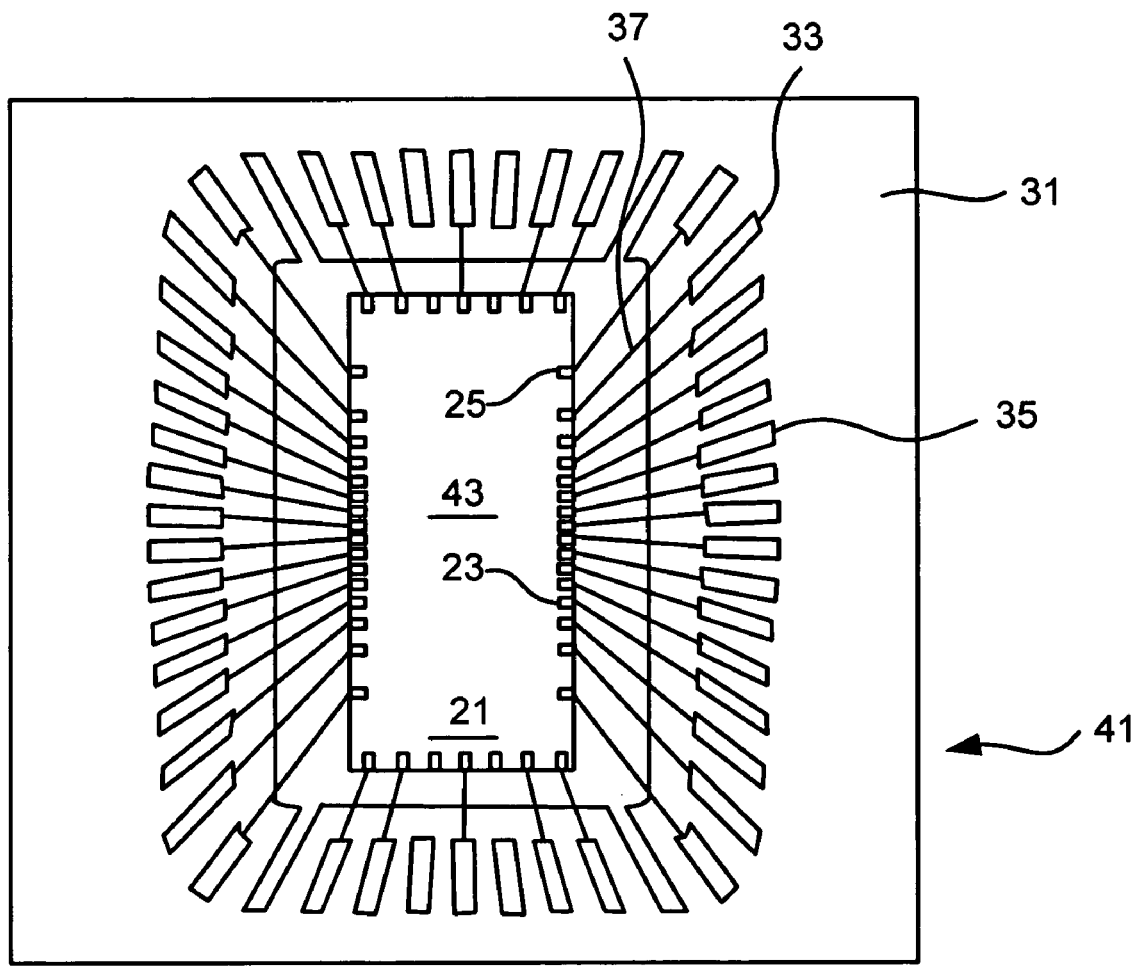
FIG. 2 is a plan view of an exemplary IC package according to the invention.

FIG. 2 is a plan view showing an exemplary arrangement of an exemplary apparatus of the invention. Exemplary IC package 41 includes package substrate 31 coupled to semiconductor chip 21. Semiconductor chip 21 includes integrated circuit 43 formed thereon. Package substrate 31 may be a lead frame such as a metal lead frame, a BGA package, or other package substrates used to connect semiconductor chip 21 to the outside world. Each of pins 33, 35 of package substrate 31 is coupled to a corresponding bond pad 23, 25 of semiconductor chip 21. In the exemplary arrangement shown in FIG. 2, semiconductor chip 21 is surrounded by and attached to package substrate 31. Other configurations and arrangements may be used in other exemplary embodiments. In one exemplary embodiment, package substrate 31 may be a lead frame formed of metal and in another exemplary embodiment, only pins 33, 35 of package substrate 31 may be formed of metal and the bulk of package substrate 31 may be formed of another material such as a ceramic or plastic. The invention also applies to flip-chip IC packages in which the bond pads of the semiconductor chip are joined to corresponding pins of the package substrate by direct coupling using solder bumps. Therefore, the coupling arrangement of IC package 41 is exemplary only. Various package substrates may be used to form the IC package and connect the IC to the outside world.

Still referring to FIG. 2, package substrate 31 includes a plurality of pins. Among the plurality of pins are a plurality of active pins 33 and a plurality of dummy or inactive pins 35. Each of active pins 33 and dummy pins 35 are connected to a corresponding bond pad formed on semiconductor chip 21 by means of a wire bond. In particular, each active pin 33 is connected to a corresponding active bond pad 23 and each dummy pin 35 is connected to a corresponding floating bond pad 25. In the illustrated embodiment of FIG. 2, each are connected by wire bond 37 and may be coupled using conventional techniques. In another exemplary embodiment, flip-chip solder bonding may be used and carried out using conventional techniques. The location of the dummy pins 35 within the plurality of pins 33 and 35 of package substrate 31, is intended to be exemplary only. In other exemplary embodiments, there may be more or less dummy pins and they may be disposed in various positions. Moreover, the arrangement of pins 33 and 35 on package substrate 31 may be different in other exemplary embodiments. Each floating bond pad 25 is electrically insulated from integrated circuit 43 formed on semiconductor chip 21. In contrast, each active bond pad 25 is coupled to and therefore forms part of integrated circuit 43 formed on semiconductor chip 21 and, as such, these active bond pads 25 may also be referred to as ic bond pads. Integrated circuit 43 may be formed on semiconductor chip 21 using conventional methods and is not shown in detail. Integrated circuit 43 may be internally coupled (i.e., not shown in FIG. 2) to active bond pads 23. Floating pads 25 are formed of the same materials and during the same processing operations used to form the components of integrated circuit 43. This will be shown in FIGS. 3-5.

Figure 3:
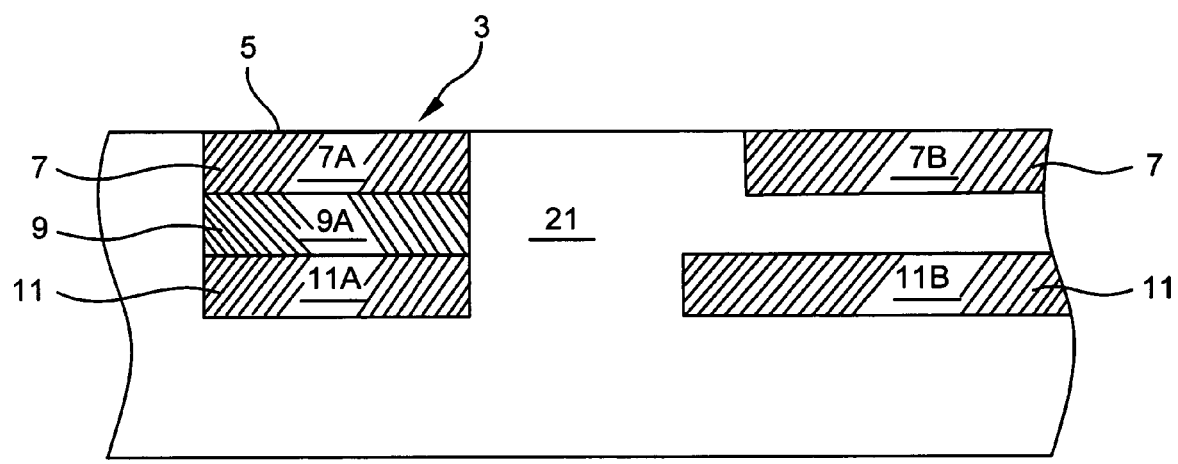
FIG. 3 is a cross sectional view of an exemplary floating bond pad of the invention.
Figure 4:
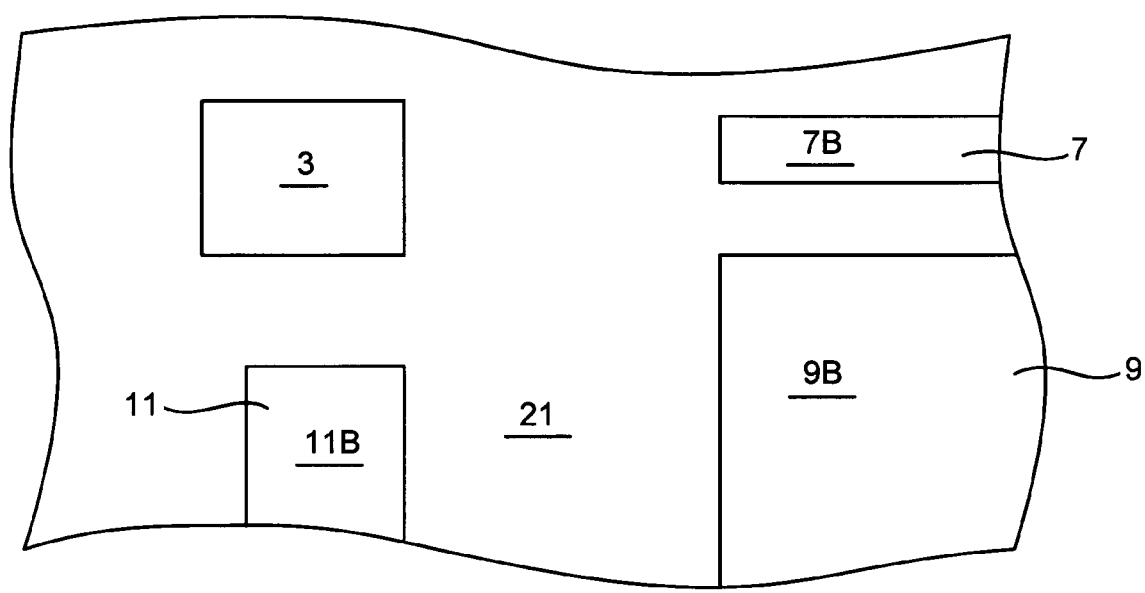
FIG. 4 is a plan view of an exemplary floating bond pad in relation to other features of the semiconductor chip according to the invention.

FIG. 3 is a cross-sectional view showing an exemplary floating bond pad. Floating bond pad 3 includes contact surface 5 and is formed of an aligned stack of discrete portions 7A, 9A and 11A of three conductive layers 7, 9, and 11. (Conductive layer 9 is shown in FIG. 4). In an exemplary embodiment, each of the conductive layers may be a metal such as aluminum, copper, or alloys thereof. Each of discrete portions 7A, 9A, 11A may be formed using conventional surface or damascene patterning techniques. The patterning techniques form a discrete isolated portion such as discrete portion 7A, from conductive layer 7 that is also patterned to form other portion 7B that forms part of the integrated circuit such as integrated circuit 43 shown in FIG. 2. Similarly, other portion 11B is formed from the same conductive layer 11 that discrete portion 11A of bond pad 3 is formed of. Each of discrete portions 7A, 9A and 11A and other portions 7B and 11B is formed on semiconductor chip 21 and floating bond pad 3 is electrically isolated from active components of the integrated circuit such as integrated circuit 43 shown in FIG. 2. The arrangement of FIG. 3 is intended to be exemplary only and in other exemplary embodiments less than all three of the conductive layers may be used to form floating bond pad 3. In other exemplary embodiments that include more than three conductive layers, floating bond pad 3 may be formed of discrete portions of one or more of the conductive layers. Although not shown, these same conductive layers may also be used to form IC bond pads of the integrated circuit.

FIG. 4 is a perspective view that illustrates floating bond pad 3 electrically insulated other portions 7B, 9B and 11B. Other portions 7B, 9B and 11B are formed from the same conductive layers 7, 9, and 11 respectively, that are patterned to form discrete portions 7A, 9A and 11A that combine to form floating bond pad 3. Floating bond pad 3 and the conductive components formed of other portions 7B, 9B and 11B are each formed on semiconductor chip 23 and the conductive components formed of other portions 7B, 9B and 11B each form part of the integrated circuit formed on semiconductor chip 21, for example integrated circuit 43 of FIG. 2.

Figure 5:
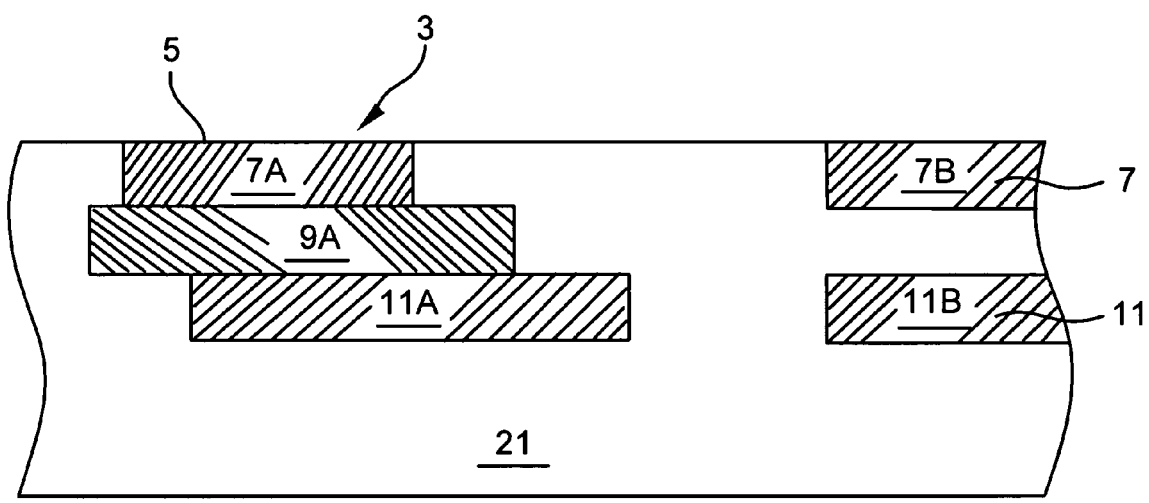
FIG. 5 is a cross sectional view of another exemplary floating bond pad of the invention.

FIG. 5 is a cross-sectional exemplary embodiment showing exemplary floating bond pad 3 having top surface 5 and formed of discrete portions 7A, 9A and 11A of respective conductive films. In the exemplary embodiment of FIG. 5, discrete portions 7A, 9A and 11A are not perfectly aligned over one another but are in physical and electrical contact. Conductive layer 7 is patterned to form discrete portion 7A as well as other portion 7B that is electrically isolated from discrete portion 7. Similarly, conductive layer 11 is patterned to form discrete portion 11A as well as other portion 11B that is electrically isolated from discrete portion 11.

Other exemplary floating bond pads can be used in other exemplary embodiments. The variously configured and aligned floating bond pads may be formed to include discrete portions of one or more of the multiple conductive layers used to form the integrated circuit device.

Referring again to FIG. 2, IC package 41 is resistant to ESD damage. More particularly, integrated circuit 43 of IC package 41 is resistant to damage when one of dummy pins 35 is subjected to ESD via contact by a human or other ESD source in the field or during assembly or testing. It has been found that the components of integrated circuit 43 are not damaged by means of ESD transferred to an adjacent pin, or any other means, when any of dummy pins 35 are zapped with an ESD. IC package 41 is resistant to damage from ESD when human body model (HBM) ESD voltages as high as 4 kV are applied to a dummy pin 35.

Although described heretofore in conjunction with an apparatus, the invention is also directed to the method for suppressing electrostatic discharge in an integrated circuit package. The method includes providing a package substrate such as a lead frame, and a semiconductor chip including an integrated circuit, as described above. The method further provides forming the floating bond pads by forming at least one discrete portion of a conductive layer that is also used to form active conductive components of the integrated circuit device. These discrete portions are advantageously formed during the formation of the semiconductor device. The method also provides for coupling the non-active pins of the package substrate to the floating bond pads of the semiconductor chip by wire bonding or by flip chip bonding which entails directly coupling the pin or conductive member of the lead frame to a corresponding bond pad of the semiconductor chip using solder. The active pins of the package substrate may be coupled to active or ic bond pads of the integrated circuit.

The preceding merely illustrates the principles of the invention. It will thus be appreciated that those skilled in the art will be able to devise various arrangements which, although not explicitly described or shown herein, embody the principals of the invention and are included within its spirit and scope. For example, although described in conjunction with one type of package substrate illustrated in FIG. 2, the concepts of the invention apply similarly to other package substrates used to form an IC package and connect the IC to the outside world. Furthermore, all examples and conditional language recited herein are principally intended expressly to be only for pedagogical purposes and to aid the reader in understanding the principals of the invention and the concepts contributed by the inventors to furthering the art, and are to be construed as being without limitation to such specifically recited examples and conditions. Moreover, all statements herein reciting principals, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An assembly comprising a package substrate having a plurality of pins and coupled to a semiconductor chip, each of said plurality of pins connected to one of:
   an ic bond pad disposed on said semiconductor chip and coupled to an integrated circuit of said semiconductor chip; and
   a floating bond pad disposed on said semiconductor chip and not conductively coupled to any further components on or in said semiconductor chip,
   wherein said integrated circuit is formed of a plurality of metal layers and said floating bond pad includes a discrete portion of each of said metal layers, each discrete portion isolated from other portions of said respective metal layer and said respective discrete portions aligned over and contacting one another.

2. The assembly as in claim 1, wherein said semiconductor chip includes a silicon substrate.

3. The assembly as in claim 1, wherein said package substrate is a metal lead frame and said plurality of pins substantially surround said semiconductor chip.

4. The assembly as in claim 1, wherein said package substrate is a BGA substrate and each of said plurality of pins is wire bonded to said one of an ic bond pad and a floating bond pad.

5. The assembly as in claim 1, wherein said assembly is resistant to damage due to ESD discharge when an HBM ESD stress of up to 4 kV, is applied to any of said plurality of pins.

6. An assembly comprising a package substrate having a plurality of contacts and coupled to a semiconductor chip, each of said plurality of contacts connected to one of:
   an ic bond pad disposed on said semiconductor chip and coupled to an integrated circuit of said semiconductor chip; and
   a floating bond pad disposed on said semiconductor chip and not conductively coupled to an active component on or in said semiconductor chip,
   wherein said integrated circuit is formed of a plurality of metal layers and said floating bond pad includes a discrete portion of each of said metal layers, each discrete portion isolated from other portions of said respective metal layer and said respective discrete portions contacting one another but misaligned with respect to one another.

7. The assembly as in claim 6, wherein each of said plurality of contacts is joined to said one of an ic bond pad and a floating bond pad using flip chip mounting techniques and further comprising solder disposed between each of said plurality of contacts and said one of an ic bond pad and a floating bond pad.

8. An assembly comprising a package substrate having a plurality of contacts and coupled to a semiconductor chip including an integrated circuit, said plurality of contacts including a plurality of active contacts that are each coupled to an ic bond pad coupled to said integrated circuit, and at least one dummy contact connected to a floating bond pad disposed on said semiconductor chip and not conductively coupled to any further components on or in said semiconductor chip, wherein said integrated circuit is formed of a plurality of metal layers and said floating bond pad includes a discrete portion of each of said metal layers, each discrete portion isolated from other portions of said respective metal layer and said respective discrete portions aligned over and contacting one another.

9. The assembly as in claim 8, wherein said package substrate is a BGA substrate and each of said plurality of active contacts is a pin wire bonded to one of said ic bond pads and each of said at least one dummy contact is a dummy pin wire bonded to said floating bond pad.

10. The assembly as in claim 8, wherein said package substrate is a flip chip and each of said plurality of active contacts is flip chip soldered to one of said ic bond pads and each of said at least one dummy contact is flip chip soldered to said floating bond pad.

11. The assembly as in claim 8, wherein said package substrate is a flip chip and each of said plurality of active contacts is flip chip soldered to one of said ic bond pads and each of said at least one dummy contact is flip chip soldered to said floating bond pad.

12. The assembly as in claim 6, wherein said package substrate is a BGA substrate, each of said plurality of pins is wire bonded to said one of an ic bond pad and a floating bond pad, and said assembly is resistant to damage due to ESD discharge when an HBM ESD stress of up to 4 kV is applied to any of said plurality of contacts.

13. The assembly as in claim 1, wherein said semiconductor chip includes a silicon substrate and each of said plurality of metal layers comprise one of copper, aluminum or alloys thereof.

14. The assembly as in claim 1, wherein said plurality of metal layers include at least one copper layer.

* * * * *